(12) United States Patent
Arvin et al.

(10) Patent No.: US 11,694,992 B2
(45) Date of Patent: Jul. 4, 2023

(54) NEAR TIER DECOUPLING CAPACITORS

(71) Applicant: International Business Machines Corporation, Armonk, NY (US)

(72) Inventors: Charles Leon Arvin, Poughkeepsie, NY (US); Bhupender Singh, Fishkill, NY (US); Joseph C. Sorbello, Wappingers Falls, NY (US); Joseph Jacobi, Hopewell Junction, NY (US); Thomas Edward Lombardi, Poughkeepsie, NY (US); Shidong Li, Hopewell Junction, NY (US); Mark William Kapfhammer, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 17/180,983

(22) Filed: Feb. 22, 2021

(65) Prior Publication Data

US 2022/0271005 A1 Aug. 25, 2022

(51) Int. Cl.
*H01L 25/065* (2023.01)
*H01L 23/522* (2006.01)
*H01L 23/528* (2006.01)
*H01L 23/64* (2006.01)
*H01L 25/16* (2023.01)

(52) U.S. Cl.
CPC ...... *H01L 25/0652* (2013.01); *H01L 23/5223* (2013.01); *H01L 23/5227* (2013.01); *H01L 23/5286* (2013.01)

(58) Field of Classification Search
CPC .................................................. H01L 25/0652
See application file for complete search history.

(56) References Cited

U.S. PATENT DOCUMENTS

| | | | |
|---|---|---|---|
| 5,798,567 A | 8/1998 | Kelly et al. | |
| 6,507,115 B2 | 1/2003 | Hofstee et al. | |
| 7,452,750 B2 | 11/2008 | Lo et al. | |
| 7,589,395 B2 | 9/2009 | Sathe et al. | |
| 2005/0189623 A1 | 9/2005 | Akram et al. | |
| 2011/0042795 A1* | 2/2011 | Knickerbocker | H01L 23/49827 257/E21.585 |
| 2014/0374877 A1* | 12/2014 | Oh | H01L 23/642 257/532 |

(Continued)

OTHER PUBLICATIONS

Anonymous, "MCM Packaging with Picture Frame of Multiple Rows of Decoupling Capacitors," IP.com Prior Art Database Technical Disclosure, Disclosed Anonymously, IP.com No. IPCOM000261345D, Feb. 24, 2020, 3 pages.

*Primary Examiner* — Omar F Mojaddedi
(74) *Attorney, Agent, or Firm* — Jeffrey M. Ingalls (57) ABSTRACT

An integrated circuit package structure is provided that includes a chip carrier substrate, at least one processor die provided on the chip carrier substrate, a plurality of lateral escape wiring lines connected to and extending away from the at least one processor die, and a plurality of chips at least partially surrounding the processor die, at least one of the chips overlapping with at least one of the lateral escape wiring lines in a plan view. An interconnect structure of the chips includes at least one vertical power feed structure that is configured and positioned not to intersect with the lateral escape wiring lines in the plan view.

14 Claims, 10 Drawing Sheets

(56) References Cited

U.S. PATENT DOCUMENTS

| | | | |
|---|---|---|---|
| 2017/0063355 A1* | 3/2017 | Thaik | H01L 23/525 |
| 2019/0312002 A1* | 10/2019 | Kwon | H01L 23/5383 |
| 2019/0363047 A1* | 11/2019 | Blackshear | H01L 24/06 |
| 2020/0219846 A1 | 7/2020 | Ji et al. | |
| 2021/0035738 A1* | 2/2021 | Goh | H01L 23/16 |

* cited by examiner

NEAR TIER DECOUPLING CAPACITORS

BACKGROUND

The present disclosure relates generally to integrated circuit packages including chips adjacent to a processor die. In particular, the present disclosure relates to the configuration and placement of decoupling capacitors in combination with escape wiring routing patterns.

In general, power decoupling has always been critical for processor dies. The high bandwidth communications within processor dies now being used, thinner more discrete wirings due to wiring escapes and reduction of available space for on die decoupling solutions have created added pressure for noise reduction. Otherwise, this may degrade processor frequency or impact minimal voltage for a given processor chip. This impacts the frequency of the processor (performance) or the thermal needs to be removed from the heat sink.

Additional capacitors for decoupling and noise filtering may be required without increasing module area or decreasing the input/output (IO) circuitry. Without a solution, frequency and noise characteristics create non-optimal electrical designs for integrated circuit package structures.

It should be apparent to those skilled in the art that, with respect to decoupling applications, proximity of the capacitor to the device is of critical importance. For a given conductor cross section, the conductor resistance (R) and inductance (L) would be expected to scale with conductor length. Thus, for high-speed switching application (high-frequency IC's), the efficacy of the decoupling solution will be limited by the R and L of those conductors and consequently limited by the length of those conductors or the proximity of the capacitor to the device.

Thus, it is often useful to position the capacitors as close as possible to the processor IC to realize performance increases. Historically, semiconductor package designs have suffered compromise regarding the trade-off between signal-interconnect escape-routing density and decoupling performance, in that these two design objectives would both compete for the same physical real-estate adjacent to the semiconductor processor die.

SUMMARY

The present embodiments overcome certain package design compromises discussed above, and further overcome additional physical or structural constraints relative to chip underfill and heat-spreader structural adhesives that would have otherwise precluded placing components in close proximity to the semiconductor processor die.

Embodiments of the present disclosure relate to an integrated circuit package structure. The integrated circuit package structure includes a chip carrier substrate; at least one processor die provided on the chip carrier substrate; a plurality of lateral escape wiring lines connected to and extending away from the at least one processor die; and a plurality of chips at least partially surrounding the processor die, at least one of the chips overlapping with at least one of the lateral escape wiring lines in a plan view. An interconnect structure of the chips includes at least one vertical power feed structure that is configured and positioned not to intersect with the lateral escape wiring lines in the plan view. The interconnect structure of the chips may allow for interdigitation of the escape wiring lines with the chips, which may enable the chips to be located closer to the processor die. This may allow for performance improvements for the integrated circuit package structure.

In some embodiments of the present disclosure, the chips completely surround the processor die. This may allow for performance improvements for the integrated circuit package structure.

In some embodiments of the present disclosure, multiple rows of the chips at least partially surround the processor die. This may allow for performance improvements for the integrated circuit package structure.

In some embodiments of the present disclosure, the chips in a first row of the chips have widths and thicknesses that are different than widths and thicknesses of the chips in a second row of the chips.

In some embodiments of the present disclosure, the multiple rows of the chips have a step-down configuration in a direction away from an edge of the processor die such that heights of the chips in each row are successively reduced. This may allow for a reduction in the overall thermo-mechanical stress applied to the processor die as well as that applied to the solder interconnect of the chips. In such an embodiment, it may be possible to avoid the need to underfill the last row of chips, thereby eliminating the need for the underfill fillet in those chips. This in turn may reduce the thermo-mechanical stress induced by thermal cycling during operations.

In some embodiments of the present disclosure, the chips are an interdigitated area array interconnected decoupling capacitors built on a silicon substrate. In some embodiments of the present disclosure, the chips are devices selected from the group consisting of inductors and resistors. This may allow for performance improvements for the integrated circuit package structure.

In some embodiments of the present disclosure, the lateral escape wiring lines are arranged in a fan-out configuration from the processor die, transitioning from a fine pitch spacing of the lateral escape wiring lines in a first area near edges of the processor die to a coarser pitch spacing of the lateral escape wiring lines in a second area corresponding to an off-module interconnect structure, and the chips are located in the first area. This may enable the chips to be located closer to the processor die. This may allow for performance improvements for the integrated circuit package structure.

In some embodiments of the present disclosure, the integrated circuit package structure further includes a plurality of secondary chips located in the second area and at least partially surrounding the chips. In some embodiments of the present disclosure, these secondary chips are low inductance interdigitated area array interconnected capacitors. This may allow for performance improvements for the integrated circuit package structure.

In some embodiments of the present disclosure, the integrated circuit package structure further includes a plurality of remote interdigitated area array interconnected decoupling capacitors positioned further away from an edge of the processor die than the chips and at least partially surrounding the chips. This may allow for performance improvements for the integrated circuit package structure.

In some embodiments of the present disclosure, the interconnect structure of the chips includes at least one pair of the vertical power feed structure and a ground structure. In some embodiments of the present disclosure, the integrated circuit package structure further includes a plurality of pairs of the vertical power feed structures and the ground structures. In some embodiments of the present disclosure, the pairs are located in each corner of the chip. The design and placement of the interconnect structure of the chips may allow for the interdigitation of the escape wiring lines and the power and ground structures of the chips. This may allow for the chips to be located closer to the processor die.

In some embodiments of the present disclosure, a method of forming an integrated circuit package structure is provided. The method includes providing a chip carrier substrate; providing at least one processor die on the chip carrier substrate; forming a plurality of lateral escape wiring lines that are connected to and extend away from the at least one processor die; and providing a plurality of chips that at least partially surround the processor die, at least one of the chips overlapping with at least one of the lateral escape wiring lines in a plan view. The interconnect structure of the chips includes at least one vertical power feed structure that is configured and positioned not to intersect with the lateral escape wiring lines in the plan view. The interconnect structure of the chips may allow for interdigitation of the escape wiring lines with the chips, which may enable the chips to be located closer to the processor die. This may allow for performance improvements for the integrated circuit package structure.

In some embodiments of the present disclosure, the chips are provided to completely surround the processor die. This may allow for performance improvements for the integrated circuit package structure.

In some embodiments of the present disclosure, multiple rows of the chips are provided to at least partially surround the processor die. This may allow for performance improvements for the integrated circuit package structure.

In some embodiments of the present disclosure, the chips in a first row of the chips have widths and thicknesses that are different than widths and thicknesses of the chips in a second row of the chips.

In some embodiments of the present disclosure, the multiple rows of the chips have a step-down configuration in a direction away from an edge of the processor die such that heights of the chips in each row are successively reduced. This may allow for a reduction in the overall thermo-mechanical stress applied to the processor die as well as that applied to the solder interconnect of the chips. In such an embodiment, it may be possible to avoid the need to underfill the last row of chips, thereby eliminating the need for the underfill fillet in those chips. This in turn may reduce the thermo-mechanical stress induced by thermal cycling during operations.

In some embodiments of the present disclosure, the chips are interdigitated area array interconnected decoupling capacitors built on a silicon substrate. In some embodiments of the present disclosure, the chips are devices selected from the group consisting of inductors and resistors. This may allow for performance improvements for the integrated circuit package structure.

In some embodiments of the present disclosure, the method includes forming the lateral escape wiring lines including arranging them in a fan-out configuration from the processor die, transitioning from a fine pitch spacing of the lateral escape wiring lines in a first area near edges of the processor die to a coarser pitch spacing of the lateral escape wiring lines in a second area corresponding to an off-module interconnect structure, and wherein the chips are located in the first area. This may enable the chips to be located closer to the processor die. This may allow for performance improvements for the integrated circuit package structure.

In some embodiments of the present disclosure, the method further includes providing a plurality of secondary chips located in the second area and at least partially surrounding the chips. In some embodiments of the present disclosure, these secondary chips are low inductance interdigitated area array interconnected capacitors. This may allow for performance improvements for the integrated circuit package structure.

In some embodiments of the present disclosure, the method further includes providing a plurality of remote decoupling capacitors positioned further away from an edge of the processor die than the chips and at least partially surrounding the chips. This may allow for performance improvements for the integrated circuit package structure.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

The above summary is not intended to describe each illustrated embodiment or every implementation of the present disclosure.

BRIEF DESCRIPTION OF THE DRAWINGS

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

The drawings included in the present application are incorporated into, and form part of, the specification. They illustrate embodiments of the present disclosure and, along with the description, explain the principles of the disclosure. The drawings are only illustrative of certain embodiments and do not limit the disclosure.

DETAILED DESCRIPTION

Embodiments will now be discussed in further detail with regard to integrated circuit packages utilizing decoupling capacitors that are located adjacent to the processor chip. In particular, the present embodiments include features where the interconnect patterns (e.g., voltage and ground interconnects) of the chips (e.g., decoupling capacitors) are inter-digitized with the escape wirings from the processor chip in such a way that the capacitors may be located closer the edges of the processor chip (e.g., in a dense region of the escape wirings near to the processor chip where a fanout of the escape wirings does not occur).

In general, power decoupling has always been critical for processor dies. The high bandwidth communications within processor dies now being used, thinner more discrete wirings due to wiring escapes and reduction of available space for on die decoupling solutions have created added pressure for noise reduction. Otherwise, this may degrade processor frequency or impact minimal voltage for a given processor chip. This impacts the speed of the processor (performance) or the thermal needs to be removed from the heat sink.

Additional capacitors for decoupling and noise filtering may be required without increasing module area or decreasing the input/output (IO) circuitry. Without developing a solution, frequency and noise characteristics create non-optimal electrical designs.

It should be apparent to those skilled in the art that, with respect to decoupling applications, proximity of the capacitor to the device is of critical importance. For a given conductor cross section, the conductor resistance (R) and inductance (L) would be expected to scale with conductor length. Thus, for high-speed switching application (high-frequency IC's), the efficacy of the decoupling solution will be limited by the R and L of those conductors and consequently limited by the length of those conductors or the proximity of the capacitor to the device.

If capacitors could be placed adjacent to the processor die and completely surround it, it would be possible to improve noise reduction by 1 to 2 orders of magnitude. This could then improve both allowed frequency of the processor and reduce thermal needs by lowering operating voltage of the package.

As the Si technology improves and laminate technology improves, it was further noted that the presence of these capacitors could aid in the yield-able core and thus have more sell-able first tier modules.

In certain embodiments of the present disclosure, a C4 or ball array connector on a capacitor is provided to enable a partial or full surrounding of multiple processor dies, components and interposers (organic, Si, glass, and ceramic) within space that would have otherwise been precluded by keep out zones adjacent to the die. By doing so, these embodiments offer additional benefits of removing constraints on heat-spreader (or lid) structural design. This allows optimization of lid structures for thermal performance and chip reliability metrics rather than providing physical clearance for capacitors.

This maintains thermal interface material ("TIM") and sealband reliability without sacrificing wiring escapes and maintains all capacitors able to make electrical connection with low R and L paths to the various core.

By placing an array of capacitors in this configuration with the necessary wiring optimization, it is possible to realize not only the above mentioned benefits of close proximity to the processor IC, but additionally the collective path of the ensemble of capacitors to the processor die. This configuration offers additional benefit of inductive loop cancelation amongst neighboring capacitors, further improving the efficacy of the decoupling solution. With appropriate optimization, the inductance of a given capacitor within the ensemble may be reduced as much as an order of magnitude below that of an isolated capacitor. Those skilled in the art will recognize these benefits may be quantified by modeling the collective configuration of the package.

In certain embodiments, there are provided multiple rows of decoupling capacitors surrounding the processor die that include different widths and different thicknesses in key areas to provide a step down of caps and thus a reduction in the overall thermo-mechanical stress applied to the processor die as well as that applied to the solder interconnect of the decoupling capacitors. In such an embodiment, it may be possible to avoid the need to underfill the last row of caps, thereby eliminating the need for the underfill fillet in those peripheral caps. This in turn may reduce the thermo-mechanical stress induced by thermal cycling during operations.

Certain embodiments may offer a reliability improvement in terms of chip package interaction (CPI), and the embodiments may add structure that helps buttress the corner of the chip. Further, such embodiments may help to mitigate certain stresses that could cause chip cracking. In certain embodiments, the capacitors may be provided in areas closer to the chip, thus saving real estate in terms of where the capacitors may be located.

In certain embodiments, the placement of the decoupling capacitors and the design of the interconnect structure may allow for vertical power feed (i.e., power feed through the layers of the package in a direction perpendicular to a main surface of the package) while interlacing lateral signal escape. In general, a top surface of a chip carrier substrate may be nearly completely covered with wiring for signal escapes. Because of this, one challenge may be finding appropriate places to locate the decoupling capacitors. In certain of the present embodiments, the interconnect structure is designed such that the signal escapes are positioned and arranged to interdigitate vertical capacitors interconnect interlaced with lateral signal escape routing (i.e., the interlacing of power and signal).

It is to be understood that the various layers and/or components shown in the accompanying drawings are not drawn to scale, and that one or more layers and/or components of a type commonly used in constructing IC packages may not be explicitly shown in a given drawing. This does not imply that the layers and/or components not explicitly shown are omitted from the actual package structures. Moreover, the same or similar reference numbers used throughout the drawings are used to denote the same or similar features, elements, or structures, and thus, a detailed explanation of the same or similar features, elements, or structures will not be repeated for each of the drawings.

Figure 1A:
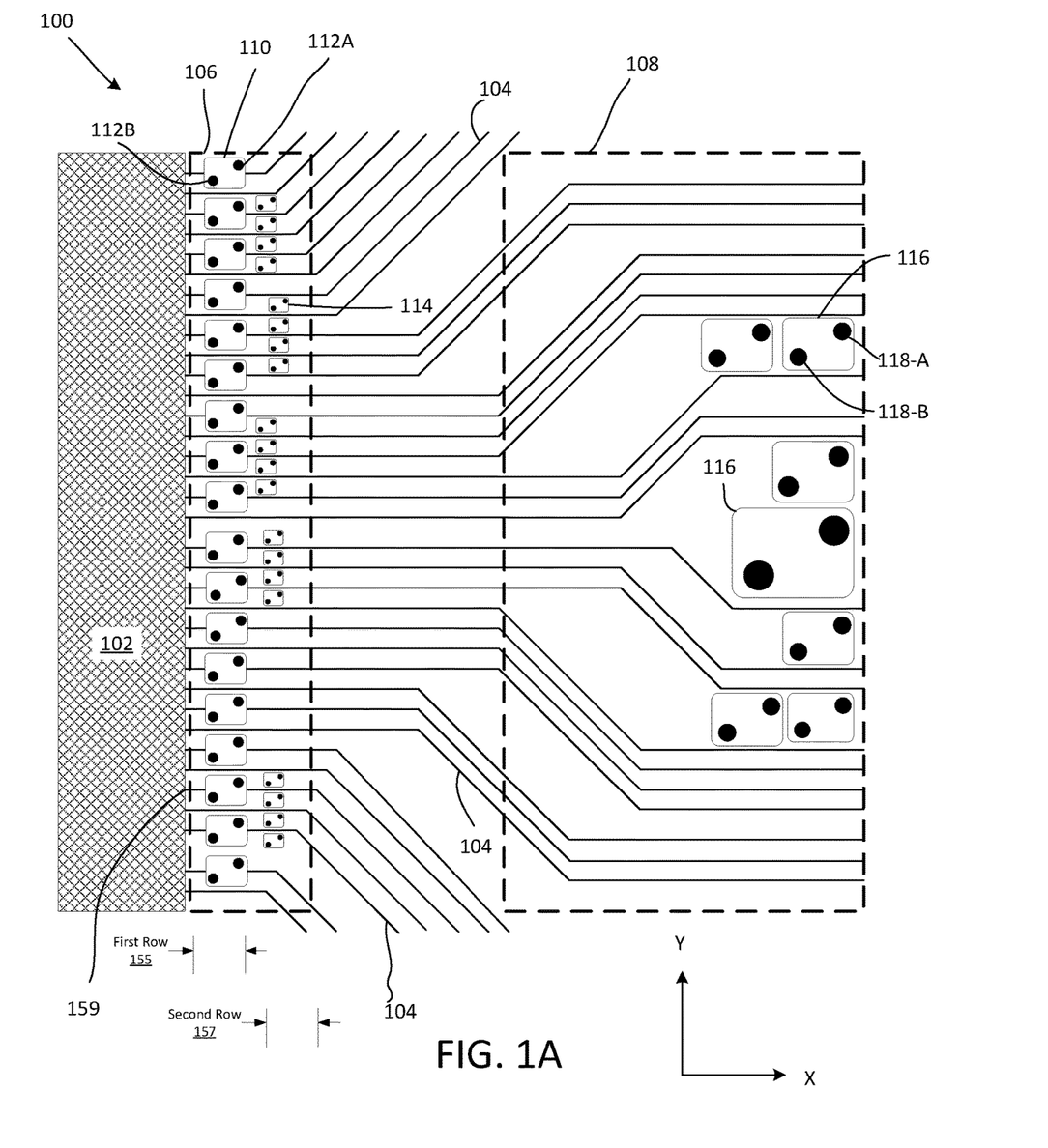
FIG. 1A is a schematic partial plan view of an example integrated circuit package structure, according to embodiments.
Figure 1B:
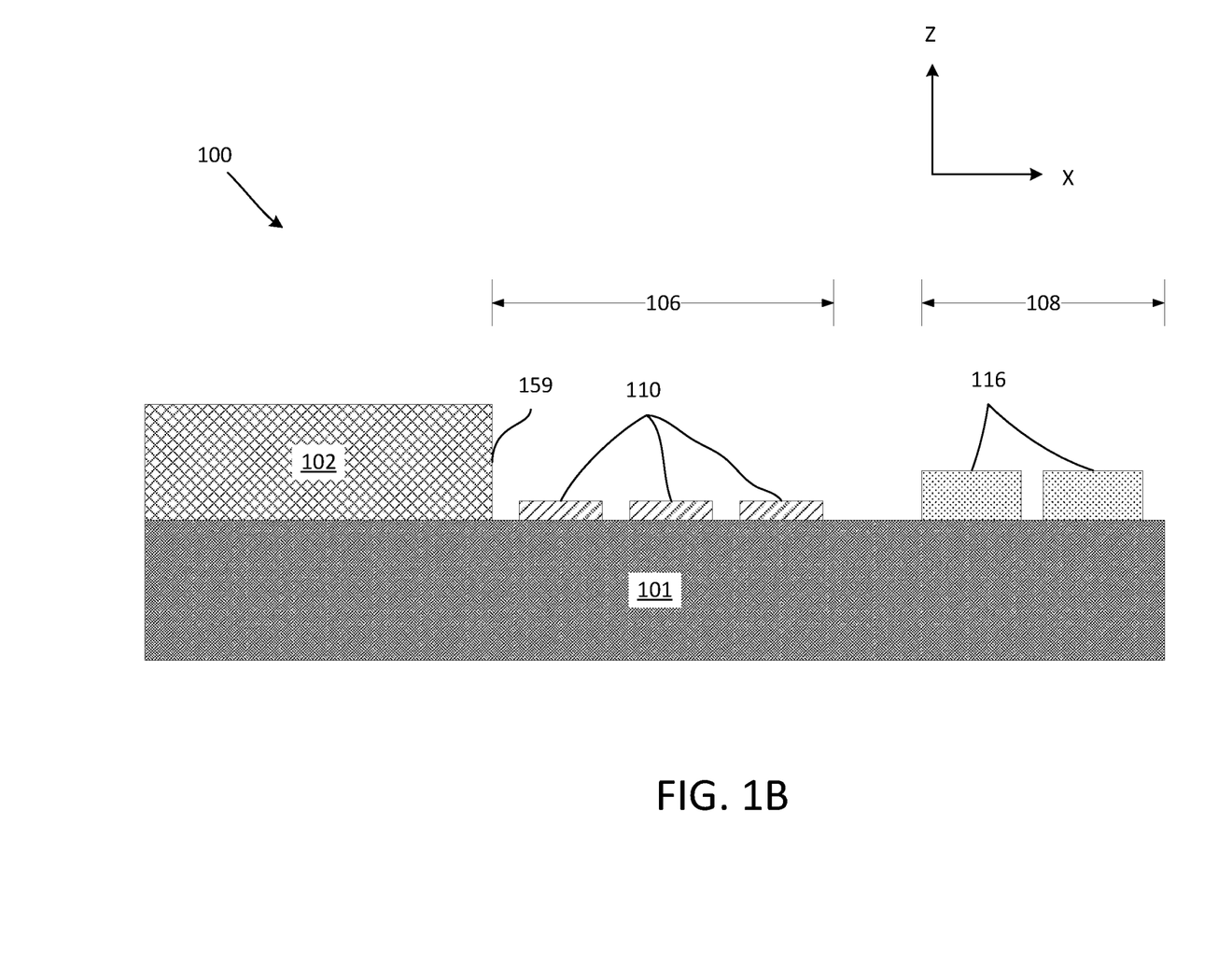
FIG. 1B is a schematic partial cross-sectional view of an example of an integrated circuit package structure, according to embodiments.

Referring now to the figures, and initially to FIGS. 1A and 1B, a partial plan view and partial cross-sectional view of an example of an integrated circuit package structure 100 are shown. Referring specifically to FIG. 1A, a partial plan view of the integrated circuit package structure 100 is shown, according to embodiments. As shown in FIG. 1A, a portion of a processor die 102 (i.e., an integrated chip, or processor chip, or die, or processor) is shown. In particular, one edge 159 or side of the processor die 102 is shown for the sake of simplicity in order to illustrate the concept of the fanout pattern of the lateral escape wiring lines 104. In general, the processor die 102 receives power from a power source (not shown) and performs certain processes, as is generally understood in the art. The output of these processes is transmitted through the lateral escape wiring lines 104. Although only one side (or edge) of the processor die 102 is shown in FIG. 1A for the sake of simplicity, it should be appreciated that the lateral escape wiring lines 104 may extend outwardly from all sides of the processor die 102. As also shown in FIG. 1A, in a first fanout area 106, the lateral escape wiring lines 104 generally extend in a direction perpendicular to the edge of the processor die 102 as shown in the plan view. However, it should be appreciated that in this first fanout area 106 at least portions of one or more lateral escape wiring lines 104 may traverse in other directions such as parallel to the edge of the processor die 102, or at an angle relative to the edge of the processor die 102, as described in further detail below. In other words, the lateral escape wiring lines 104 may extend in either the X or Y direction (or an any suitable angle relative to the X and Y directions) in either the first fanout area 106 or the second fanout area 108.

As shown in FIG. 1A, in certain examples, in the first fanout area 106, the lateral escape wiring lines 104 are arranged at a relatively fine pitch (i.e., they are positioned close together) and correspond with outputs of the processor die 102. However, as the lateral escape wiring lines 104 extend further away from the processor die 102, the spacing therebetween generally becomes further apart. In particular, in a second fanout area 108 it can be seen that at least some of the lateral escape wiring lines 104 are spaced further apart at a courser pitch relative to the first fanout area 108. It should be appreciated that although only a partial plan view is shown in FIG. 1A, that two or more fanout steps may be utilized (i.e., a third, fourth, fifth fanout area etc.) to progressively space the lateral escape wiring lines 104 further apart as needed. It should also be appreciated that the arrangement and number of lateral escape wiring lines 104 shown in FIG. 1A is not limiting, and what is shown is merely to illustrate to concept of fanout and reducing the density of the wiring lines in a direction away from the center of the processor die 102.

As also shown in FIG. 1A, a plurality of chips 110 are shown positioned in the first fanout area 106. Each of the chips 110 may include an interconnect structure having a plurality of interconnect structures. In certain embodiments, the chips 110 are interdigitated area-array interconnected decoupling capacitors. In certain examples, the chips 110 may be 0.1 μF or 3.0 μF silicon capacitors, or any other suitable value. However, in other embodiments, the chips 110 may be another suitable type of microelectronic device such as, for example, an inductor or a resistor. The chips 110 may also include any combination of capacitors, inductors, and resistors. In the example where the chip 110 is a decoupling capacitor, the chip 110 includes at least one vertical power feed structure (i.e., a voltage interconnect 112A) and at least one ground connection (i.e., a ground interconnect 112B). As will be discussed in further detail below, the chip 110 may have any number of interconnection structures (or suitable number of pairs of interconnection structures), and they may be arranged in different patterns other than that shown in FIG. 1A. It should also be appreciated that although the chips 110 shown in FIG. 1A are shown in a certain arrangement and have different sizes, this is not to be construed as limiting. There may be any suitable number of chips 110, and they may be of any suitable size(s), arrangement, and/or orientation. In certain embodiments, the chips 110 at least partially surround the processor die 102. In other embodiments, the chips 110 completely surround (i.e., are placed in positions around the entire perimeter of the chips as shown, for example, in FIG. 2A) the processor die 102 (e.g., if the processor die 102 is a square or rectangle, then a plurality of chips 110 may be on each side of the die).

In certain embodiments, as shown in FIG. 1A, there may be multiple rows of chips surrounding the processor die 102. In the example shown in FIG. 1A, the chips include a first row 155 of chips 110 and a second row 157 of second chips 114. In the first row 155, the chips 110 are larger than the second chips 114 in the second row 157. In this regard, the chips 110 in the first row 155 may have larger width/length/height dimensions that the second chips 114 in the second row 157.

As also shown in FIG. 1A, in certain embodiments, the integrated circuit package structure 100 may also include a plurality of secondary chips 116 in the second fanout area 108. In certain examples, these secondary chips 116 may be larger than the chips 110 located in the first fanout area 106. Also, in certain examples, the secondary chips 116 may be positioned and arranged such that the secondary ground interconnects 118A and the secondary voltage interconnects 118B do not intersect with (or are not interdigitized with) the lateral escape wiring lines 104. In this regard, as shown in FIG. 1A, due to the relatively course spacing of the lateral escape wiring lines 104 in the second fanout area 108, there are empty spaces in which to fit the secondary chips 116 without having them interfere with the lateral escape wiring lines 104. In certain embodiments, the secondary chips 116 are of a different type than the chips 110. For example, whereas the chips 110 may be interdigitated area-array interconnected decoupling capacitors, the secondary chips 116 may be remote ceramic capacitors such as a commercially available multi-layer ceramic capacitor ("MLCC"). The number of secondary chips surrounding the processor die 102 may be about 130 or any other suitable number based on the size and configuration of the one or more processor dies 102. Thus, as is evident from FIG. 1A, due to the restriction that the secondary chips 116 should not interfere with the lateral escape wiring lines 104 and due to the relative larger size of the secondary chips 116, there are certain limitations with regard to how close these secondary chips 116 may be to the edge 159 of the processor die. As explained in some detail above, there are certain performance increases that may be realized by locating the chips 110 or the secondary chips 116 closer to the edge 159. In particular, eliminating the trade-off between signal-interconnect escape-routing density, it is possible to place needed decoupling capacitors within these regions. The proximity can allow mitigation of 100 MHz noise or greater. This may impact the frequency of the processor (performance) by a certain percent or may be used to offset the thermal needs to be removed from the heat sink on the order of 5 to 10° C. Thus, with the use of the secondary capacitors 116 in the second fanout area 108, it may not be possible to achieve greater performance boost. However, according the present embodiments, by including the chips 110 (e.g., interdigitated area array interconnected decoupling capacitors) closer to the processor die 102 in the first fanout area 106 (and in certain examples completely surrounding the processor die 102), it may be possible to further reduce the 100 MHz noise and increase the frequency by about 5 to 8% of the processor die 102. It should be appreciated that in certain embodiments, only the chips 110 are provided in the integrated circuit package structure without including the secondary chips 116.

Referring now to FIG. 1B, this figure shows a partial cross-sectional view of an example of an integrated circuit package structure 100 similar to the one shown and described above with respect to FIG. 1A, according to embodiments. As shown in FIG. 1B, a chip carrier substrate 101 is provided. The processor die 102 is mounted on the chip carrier substrate 101, along with a plurality of chips 110 and secondary chips 116. In the example shown in FIG. 1B, three different rows of chips 110 are provided in the first fanout area 106, where the size of the chips 110 in each of the three rows are the same. As described further herein, it should be appreciated that the size, position, number, number of rows, and general layout of the various chips 110 within the first fanout area 106 may be adjusted in any suitable manner. As also shown in FIG. 1B, a plurality of rows of secondary chips 116 are also included in the second fanout area 116. It is also apparent from this cross-sectional view of FIG. 1B that the chips 110 are located closer to the edge 159 of the processor die 102 in the X direction than the secondary chips 116.

Figure 2A:
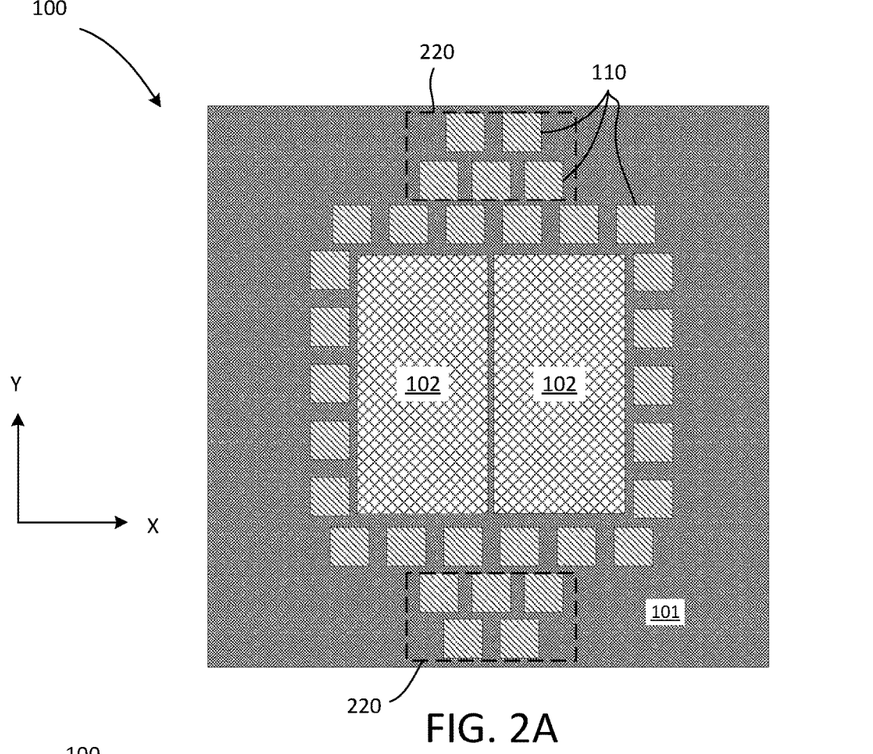
FIG. 2A is a plan view of an example integrated circuit package structure with a multi-chip module ("MCM") configuration and a pattern of chips surrounding the processor dies of the MCM, according to embodiments.
Figure 2B:
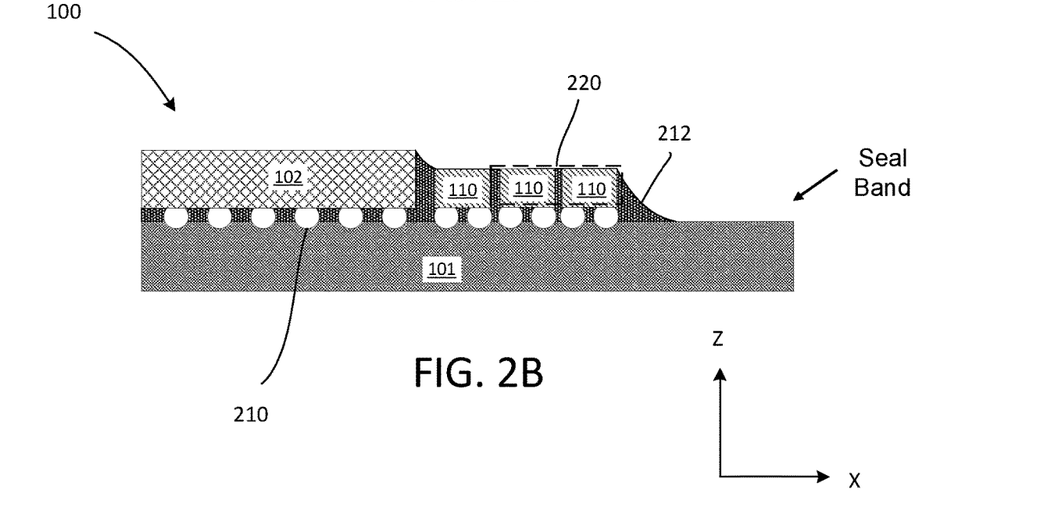
FIG. 2B is a partial cross-sectional view of the example integrated circuit package structure of FIG. 2A, according to embodiments.

Referring now to FIGS. 2A and 2B, these figures show a plan view and a partial cross-sectional view, respectively, of an example integrated circuit package structure 100 with a dual processor die 102 configuration (i.e., a MCM configuration) and a different pattern of chips 110 surrounding the processor dies 102, according to embodiments. As shown in the plan view of FIG. 2A, a chip carrier substrate 101 is provided. The processor die 102 is mounted on the chip carrier substrate 101, along with a plurality of chips 110. As shown in FIG. 2A, one row of the chips 110 completely surrounds the processor die 102. Also, additional chips 110 partially surround the processor die 102 in peripheral areas 220 in areas corresponding to a boundary between the adjacent processor dies 102. In this example, as shown in FIGS. 2A and 2B, the three different rows of chips 110 are provided in the first fanout area 106 (see, FIGS. 1A and 1B), and the sizes of the chips 110 in each of the three rows are the same. As also shown in FIG. 2B, solder bumps 210 are provided between the chip carrier substrate 101 and the processor die 102, and a fillet 212 is formed to surround the chips 110 and to provide underfill for the processor die 102.

In certain embodiments where there are two or more rows of chips 110 surrounding the processor die 102 (or plural processor dies 102 in the case of an MCM), the rows of chips 110 may be configured in a step-down configuration where the chips 110 gradually get smaller/shorter with each row in a direction away from the processor die 102. However, it should be appreciated that in other embodiments, the rows of chips 110 may be configured in a step-up configuration where the chips 110 gradually get larger/higher with each row in a direction away from the processor die 102. Likewise, the chips 110 in multiple rows may be of the same size as in the example described above with respect to FIGS. 2A and 2B.

Figure 3A:
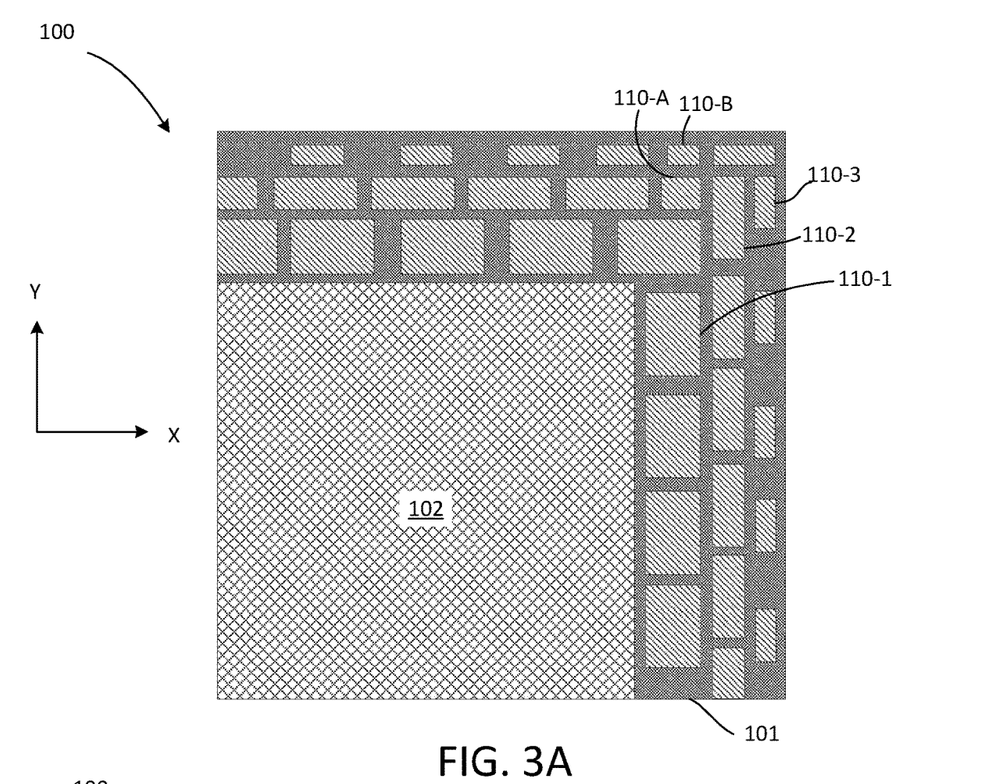
FIG. 3A is a partial plan view of an example integrated circuit package structure including a multiple row step-down pattern of chips surrounding the processor die, according to embodiments.
Figure 3B:
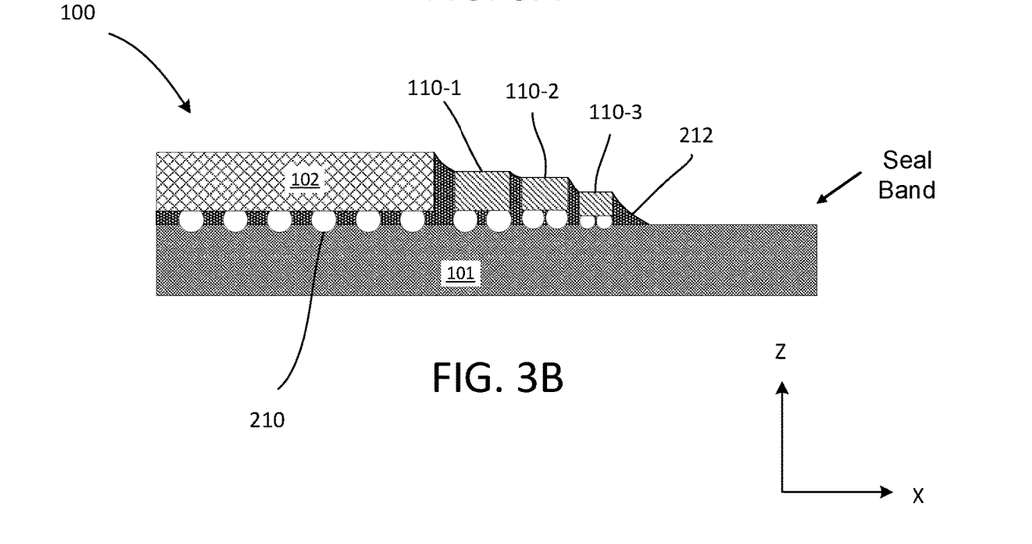
FIG. 3B is a partial cross-sectional view of an example integrated circuit package structure including a multiple row step-down pattern of chips surrounding the processor die, according to embodiments.

Referring now to FIGS. 3A and 3B, these figures show a partial plan view and a partial cross-sectional view, respectively, of an example integrated circuit package structure 100 including a multiple row step-down pattern of chips 110-1, 110-2 and 110-3 surrounding the processor die 102, according to embodiments. As shown in the partial plan view of FIG. 3A, a chip carrier substrate 101 is provided. The processor die 102 is mounted on the chip carrier substrate 101, along with the plurality of rows chips 110-1, 110-2 and 110-3. As shown in FIG. 3A, in this example, each row of the chips 110-1, 110-2 and 110-3 completely surrounds the processor die 102. In this example, as shown in FIGS. 3A and 3B, the three different rows of chips 110-1, 110-2 and 110-3 are provided in the first fanout area 106 (see, FIGS. 1A and 1B), and the sizes of the chips 110 in each of the three rows gradually decrease in a direction away from the processor die. In particular, a first row of chips 110-1 has the relatively largest size/height, a second row of chips 110-2 has an intermediate size/height, and a third row of chips 110-3 has the relatively smallest size/height or the chips 110. As also shown in FIG. 2B, solder bumps 210 are provided between the chip carrier substrate 101 and the processor die 102, and a fillet 212 is formed to surround the chips 110 and to provide underfill for the processor die 102. It should be appreciated that not all of the chips 110 in a particular row of chips need to be the same size. In the example shown in FIG. 3A, a first corner chip 110-A has a smaller size than the remainder of the chips in the second row of chips 110-2, and a second corner chip 110-B has a smaller size than the remainder of the chips in the third row of chips 110-3. In certain examples these corner chip may be about half the size of the remainder of the chips in the respective row of chips, and this size difference may facilitate the lateral escape wiring line 104 routing through the angled open regions near the corners of the processor die 102. It should be appreciated that any other suitable size, pattern, or arrangement of chips 110 may be utilized in the present embodiments.

Figure 4:
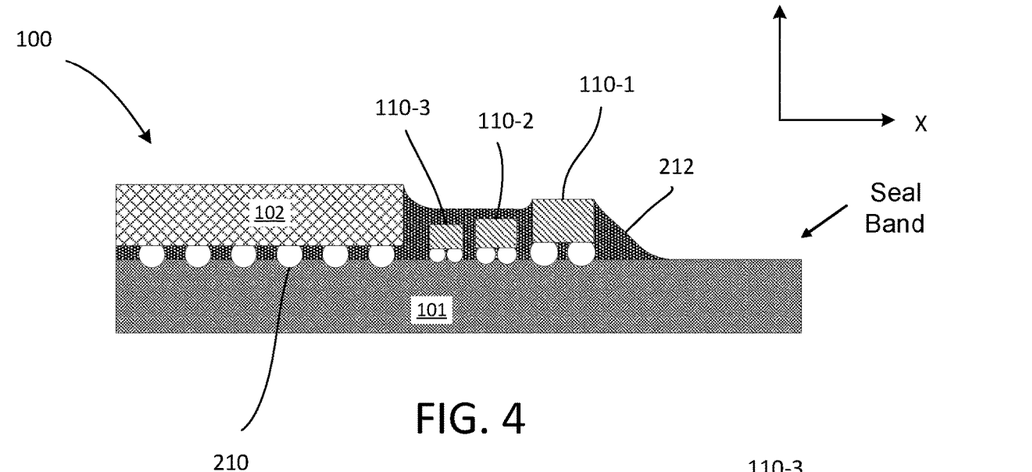
FIG. 4 is a partial plan view of an example integrated circuit package structure including a multiple row step-up pattern of chips surrounding the processor die, according to embodiments.

Referring now to FIG. 4, this figure shows a partial plan view of an example integrated circuit package structure 100 including a multiple row step-up pattern of chips 110-1, 110-2 and 110-3 surrounding the processor die 102, according to embodiments. As shown in the partial plan view of FIG. 4, a chip carrier substrate 101 is provided. The processor die 102 is mounted on the chip carrier substrate 101, along with the plurality of rows of chips 110-1, 110-2 and 110-3. As shown in FIG. 4, in this example, each row of the chips 110-1, 110-2 and 110-3 completely surrounds the processor die 102. In this example, as shown in FIGS. 4, the three different rows of chips 110-1, 110-2 and 110-3 are provided in the first fanout area 106 (see, FIGS. 1A and 1B), and the sizes of the chips 110 in each of the three rows gradually increase in a direction away from the processor die (i.e., the X direction as shown in FIG. 4). In particular, a third row of chips 110-3 has the smallest size/height and is closest to the processor die 102, a second row of chips 110-2 has an intermediate size/height, and a first row of chips 110-1 has the largest size/height of the chips 110 and is furthest away from the processor die 102. As also shown in FIG. 4, solder bumps 210 are provided between the chip carrier substrate 101 and the processor die 102, and a fillet 212 is formed to surround the chips 110 and to provide underfill for the processor die 102. It should be appreciated that not all of the chips 110 in a particular row of chips need to be the same size.

Figure 5:
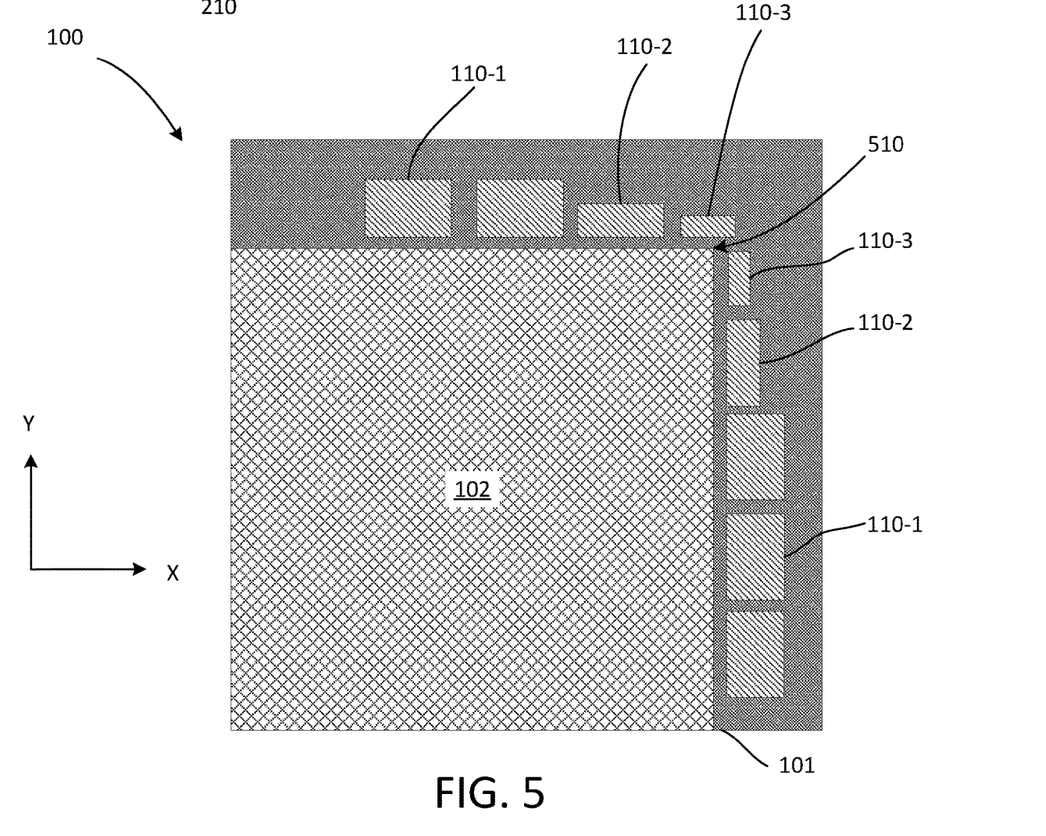
FIG. 5 is a partial plan view of an example integrated circuit package structure including a single row step-down pattern of chips surrounding the processor die, according to embodiments.

Referring now to FIG. 5, this figure shows a partial plan view of an example integrated circuit package structure 100 including a single row step-down pattern of chips 110-1, 110-2 and 110-3 surrounding the processor die 102, according to embodiments. As shown in the partial plan view of FIG. 5, a chip carrier substrate 101 is provided. The processor die 102 is mounted on the chip carrier substrate 101, along with the plurality of chips 110-1, 110-2 and 110-3. As shown in the example of FIG. 5, the three different sized of chips 110-1, 110-2 and 110-3 are provided in the first fanout area 106 (see, FIGS. 1A and 1B), and the sizes of the chips 110-1, 110-2 and 110-3 gradually decrease nearer to corners 510 of the processor die 102. In particular, first chips 110-1 have the relatively largest size/height, second chips 110-2 have an intermediate size/height, and third chips 110-3 have the relatively smallest size/height. In certain examples, the underfill fillet (see e.g., FIG. 4, fillet 212) may be modified near the corners 510 of the processor die 102. Also, the thickness of the chips 110-1, 110-2 and 110-3 may be staggered (as well as the respective sizes of the corresponding C4 solder bumps) to alter any corner stress near the edge of the processor die 102.

Figure 6:
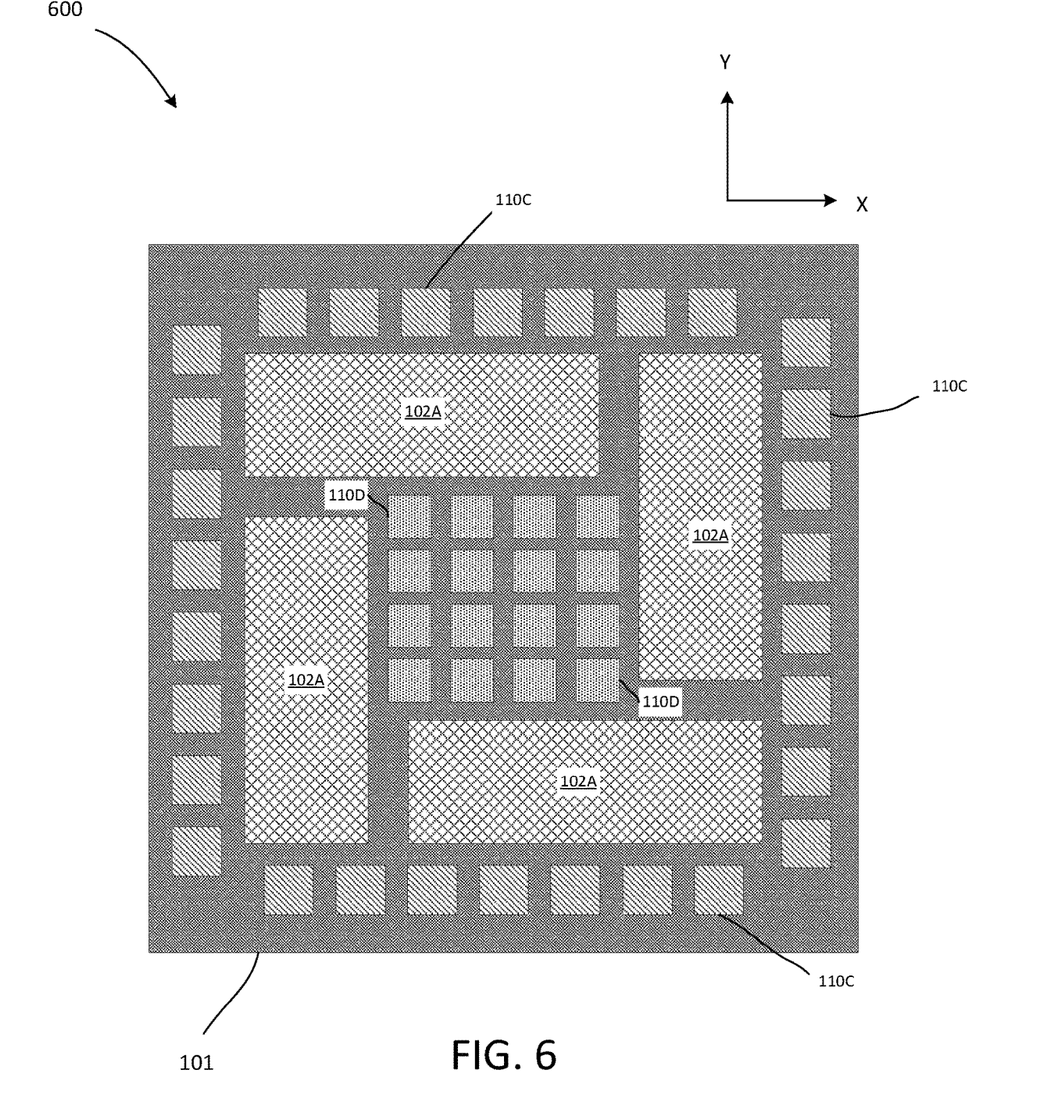
FIG. 6 is a plan view of an example integrated circuit package structure including a plurality of processor dies in an MCM, and a pattern of chips both inside and outside the chips of the MCM, according to embodiments.

Referring now to FIG. 6, this figure is a plan view of an example integrated circuit package structure including a plurality of processor dies in a multi-chip module ("MCM"), and a pattern of chips both inside and outside the chips of the MCM, according to embodiments. In certain embodiments, there may be a plurality of processor dies 102A, 102B, 102C an 102D included in a multi-chip module ("MCM") 600. In general, a multi-chip module 600 may be an electronic assembly (such as a package with a number of conductor terminals or pins) where multiple integrated circuits (ICs or processor chips), semiconductor dies and/or other discrete components are integrated, usually onto a unifying substrate, so that in use the MCM 600 may be treated as if it were a larger IC. In certain embodiments utilizing an MCM, it should be appreciated that depending on the particular number and arrangements of the processor dies 102A, 102B, 102C and 102D, the peripheral chips 110C may partially surround any one of the given processor dies 102A, 102B, 102C an 102D, but they may completely surround the MCM 600 as a whole. In certain embodiments, there may also be (or alternatively be) a plurality of interior chips 110D that exist in a space between the processor dies 102A, 102B, 102C an 102D.

Several examples of different sizes and patterns of chips 110 and processor die(s) 102 have been shown with respect to FIGS. 1A-6. However, it should be appreciated that any other suitable size, pattern, or arrangement of chips 110 may be utilized in the present embodiments.

As discussed above, the electrical interconnect to the decoupling capacitors runs vertically through the levels of the package through vias, whereas the signal escape lines run laterally (i.e., generally outward relative to the edge of the processor die 102 in plan view). The present embodiments enable the interdigitation of the lateral escape wiring lines 104 with the chips 110 by strategically positioning/spacing both the lateral escape wiring lines 104 and the interconnections of the chips 110 (e.g., the decoupling capacitors) so that they do not interfere with each other. It should be appreciated that this concept of interdigitation applies to any of the embodiments discussed above with respect to FIGS. 1A-6.

Figure 7:
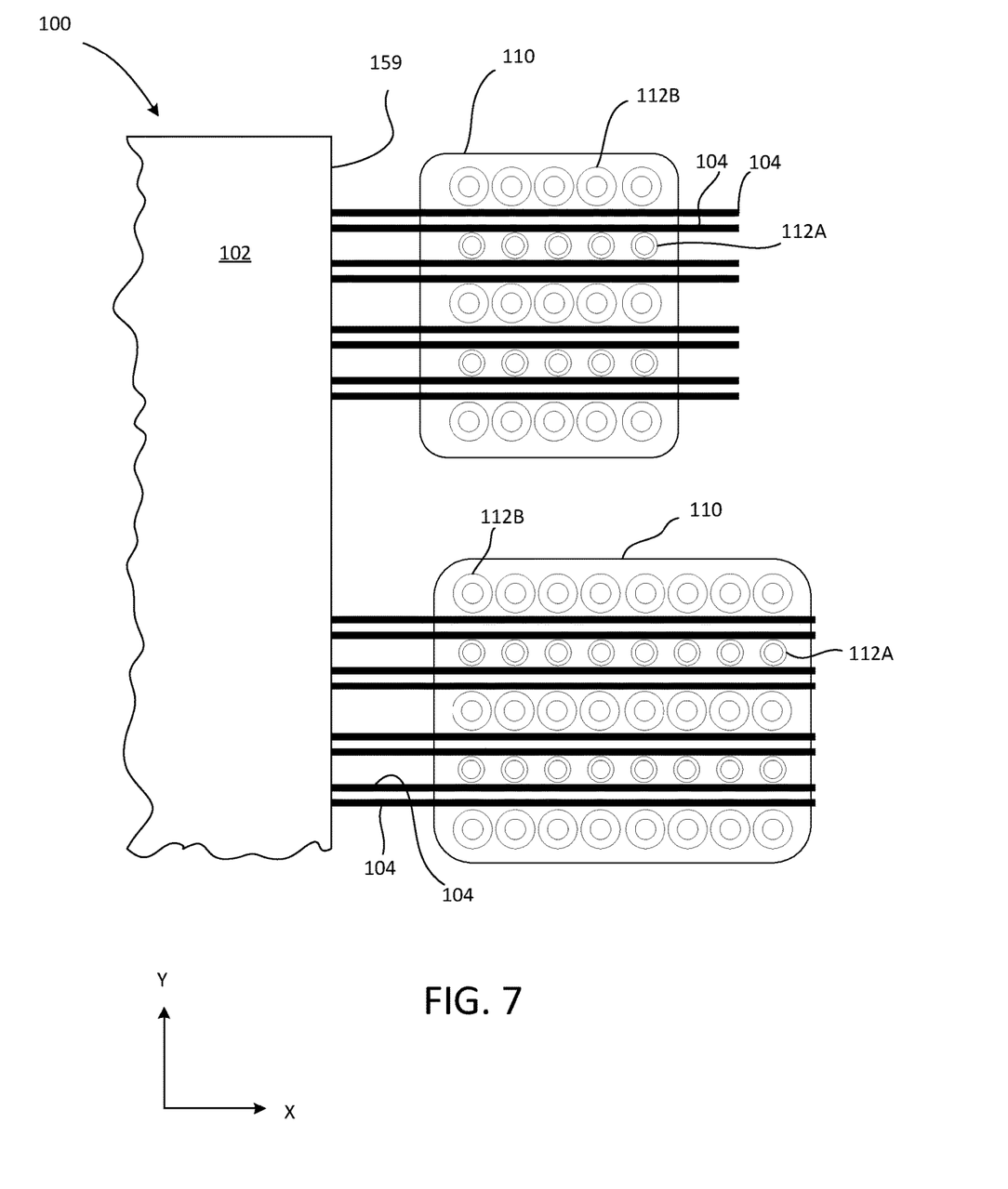
FIG. 7 is an enlarged partial plan view of an example configuration of a chip interconnect pattern, according to embodiments.

Referring now to FIG. 7, this figure shows an enlarged partial plan view of an example configuration of a chip 110 interconnect pattern, according to embodiments. Similar to certain of the embodiments discussed above, FIG. 7 shows a processor die 102 having a plurality of lateral escape wiring lines 104 (only partially shown in FIG. 7) extending from the processor die 102. Also, two chips 110 (e.g., decoupling capacitors) are shown adjacent to the edge 159 of the processor die 102. Although only two chips 110 are shown in FIG. 7 for ease of illustration, the concepts in FIG. 7 relating to interdigitation may apply to any suitable number/pattern/size/placement of the chips 110 and may also apply to any of the embodiments described above with respect to FIGS. 1A-6. As shown in FIG. 7, both of the chips 110 have an interconnect pattern that includes a plurality of ground interconnects 112A and a plurality of voltage interconnects 112B. In this example (for either of the chips 110 shown in FIG. 7), rows of ground interconnects 112A (extending in the X direction) alternate in the Y direction with rows of voltage interconnects 112B (also extending in the X direction). The lateral escape wiring lines 104 are routed in the spaces between the alternating rows of interconnections. In other words, the placement/spacing/routing etc. of the lateral escape wiring lines 104 and the placement/size/pattern etc. of the ground interconnects 112A and voltage interconnects 112B of the chip 110 are configured in view of each other so that there is no interference between the interconnect and the escape wiring. That is, the lateral escape wiring lines 104 are interdigitated (or interleaved) with the interconnect pattern. By configuring these elements as shown in FIG. 7, it becomes possible to locate the chips 110 closer to the processor die 102 than could be achieved with the secondary chips 116 (i.e., remote ceramic capacitors such as a commercially available MLCC discussed above with respect to FIG. 1A. As discussed above with regard to the secondary chips 116 shown in FIG. 1A, these can be placed in the second fan out area 108 where there is more space between adjacent lateral escape wiring lines 104. However, in the present embodiments, the lateral escape wiring lines 104 do not interfere with the interconnect pattern of the chip 110, thereby allowing the overall chip 110 to overlap with certain of the lateral escape wiring lines 104 in plan view. In other words, even though the X and Y dimensions (i.e., the length and width) of the chip 110 are greater than the pitch between adjacent lateral escape wiring lines 104, the chip 110 may still be placed in this area closer to the edge 159 of the processor die 102, thus leading to performance increases of the processor die 102.

Figure 8:
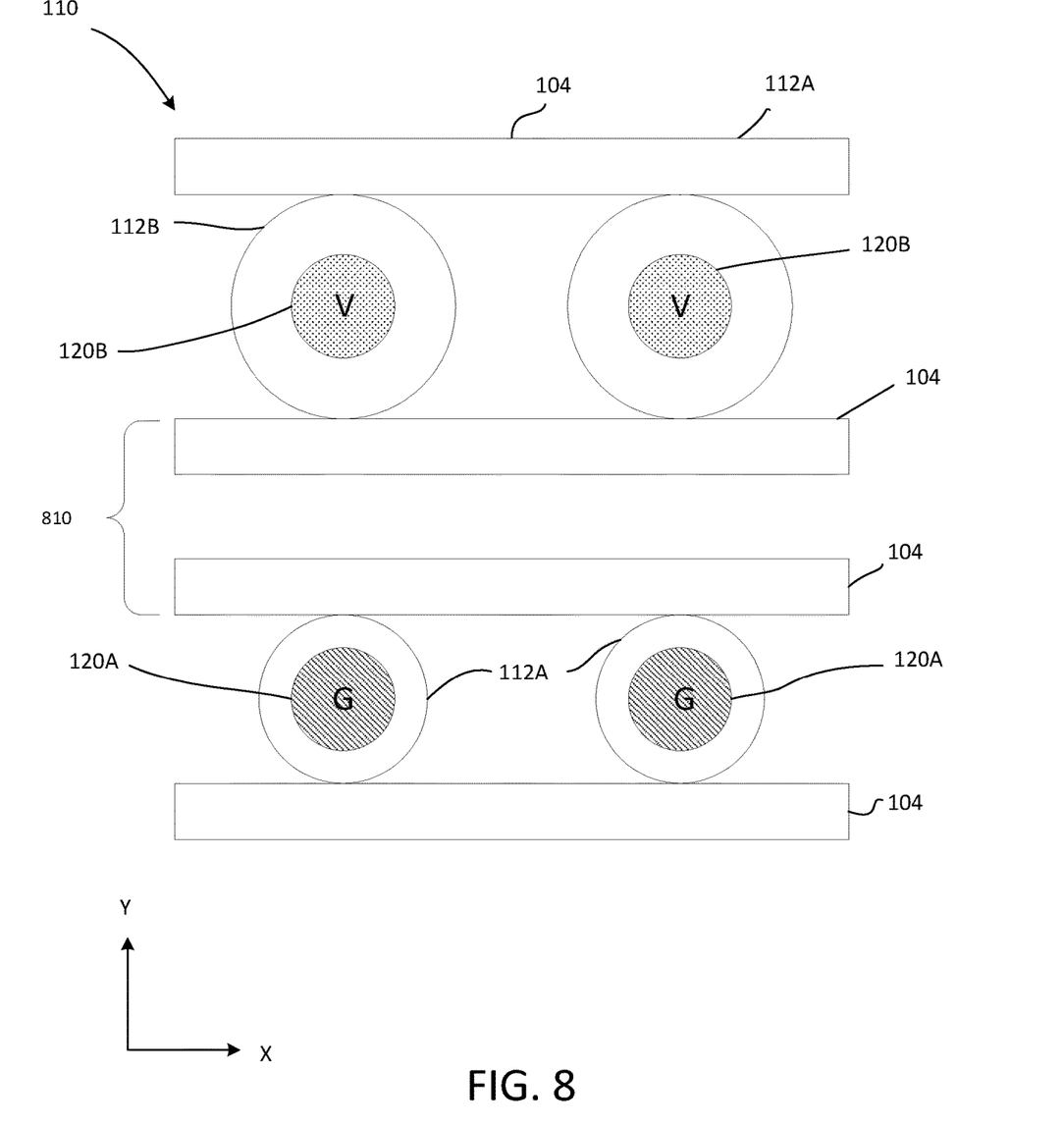
FIG. 8 is an enlarged partial plan view of the chip and interconnect pattern shown in FIG. 7, according to embodiments.

Referring now to FIG. 8, this figure shows an enlarged partial plan view of the chip 110 and interconnect pattern shown in FIG. 7, according to embodiments. FIG. 8 illustrates an example of certain dimensions that may be applied to elements of the interconnect pattern and escape lines. As shown in FIG. 8, the chip 110 includes a plurality of lateral escape wiring lines 104, where two adjacent lines correspond to a differential pair 810. The ground interconnects 112A have a ground via, and the voltage interconnects 112B also have a ground via 120B. Thus, it is possible to route the lateral escape wiring lines 104 between the voltage interconnect 112B and the ground interconnect 112A (i.e., interdigitated with) for the same chip 110.

Figure 9A:
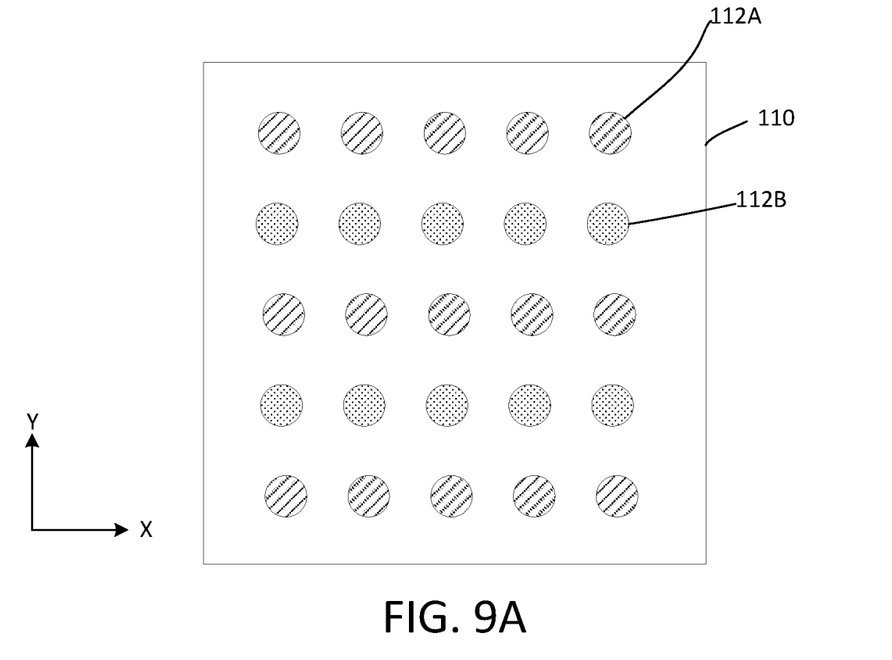
FIGS. 9A-9D are plan views of different examples of chip interconnect patterns, according to embodiments.

Referring now to FIGS. 9A-9D, different examples of chip 110 interconnect patterns (e.g., the interconnects of a silicon decoupling capacitor) are shown, according to embodiments. As shown in FIG. 9A, the chip 110 includes a plurality of ground interconnects 112A and a plurality of voltage interconnects 112B. In one example, in a package, on a laminate side, all of the ground interconnects 112A may be shorted together, and that wall of ground interconnects may go down into the laminate and into the package. Thus, these ground interconnects 112A may prevent the ability to route lateral escape wiring lines 104 in those locations. In particular, in the example shown in FIG. 9A, routing a lateral escape wiring line 104 in the Y direction (i.e., parallel to a particular edge of the processor die 102) across any given row of ground interconnects 112A may not be possible. In FIG. 9A, the X direction is perpendicular to the particular edge of the processor die 102. Thus, in the example shown in FIG. 9A, there may be certain restrictions in how a lateral escape wiring line 104 (not shown in FIG. 9A) can be routed beneath the footprint of this particular chip 110 (e.g., a decoupling capacitor).

Figure 9B:
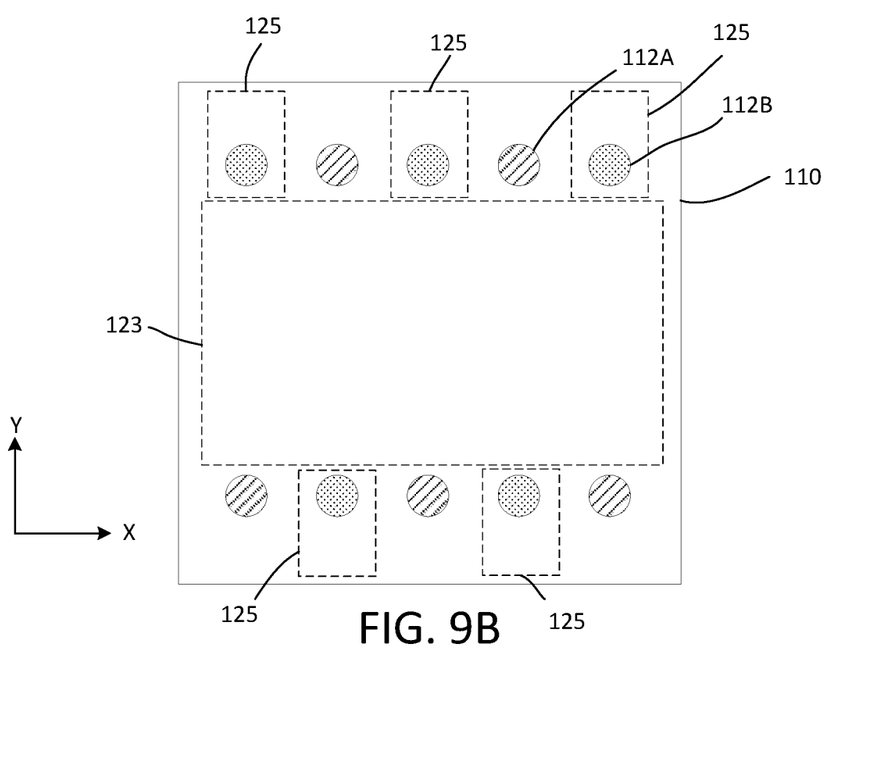

Referring now to FIG. 9B, this figure shows a plan view of a different chip 110 interconnect pattern, according to certain embodiments. In this example, the pattern of the upper row of interconnects is an alternating pattern of ground interconnects 112A and voltage interconnects 112B. This may enable routing of the lateral escape wiring lines 104 in either the X or Y direction in the middle area 123 between the rows of interconnects. This wider area between the adjacent ground interconnects 112A also may enable routing of the lateral escape wiring lines 104 in the Y direction (i.e., in a direction parallel to the edge of the processor die 102 in the side areas 125 shown in FIG. 9B.

Figure 9C:
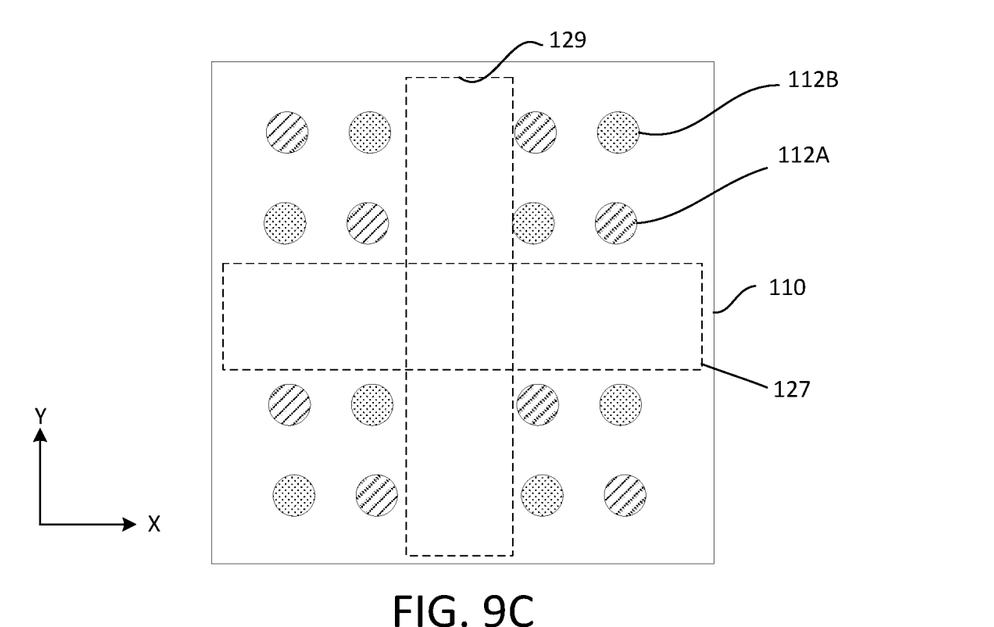

Referring now to FIG. 9C, this figure shows a plan view of a different chip 110 interconnect pattern, according to certain embodiments. In this example, the pattern of each row of interconnects is an alternating pattern of ground interconnects 112A and voltage interconnects 112B. This may enable routing of the lateral escape wiring lines 104 in either the X or Y direction in the horizontal middle area 127 between the rows of interconnects. This wider area between the adjacent ground interconnects 112A also may enable routing of the lateral escape wiring lines 104 in the Y direction (i.e., in a direction parallel to the edge of the processor die 102 in the vertical middle area 129 shown in FIG. 9C.

Figure 9D:
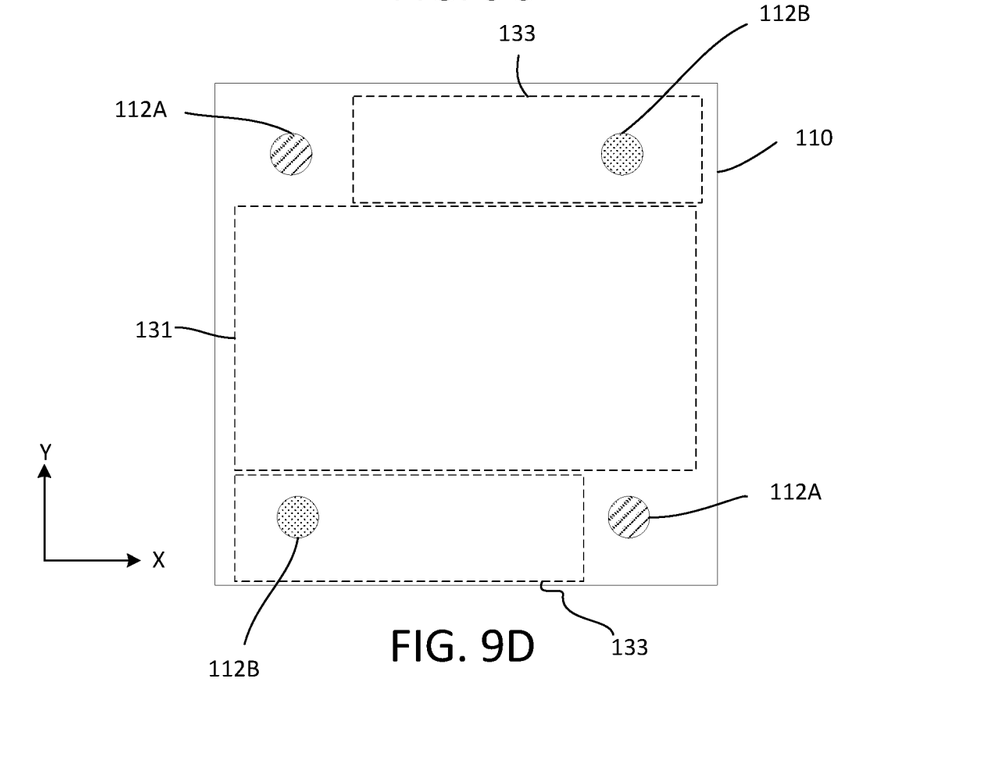

Referring now to FIG. 9D, this figure shows a plan view of a different chip 110 interconnect pattern, according to certain embodiments. In this example, there are a total of four interconnects in an alternating square pattern of ground interconnects 112A and voltage interconnects 112B. This may enable routing of the lateral escape wiring lines 104 in either the X or Y direction in the large middle area 131 between the rows of interconnects. This wider space between the adjacent ground interconnect 112A and voltage interconnect 112B also may enable routing of the lateral escape wiring lines 104 in the Y direction (i.e., in a direction parallel to the edge of the processor die 102 in the upper areas 133 shown in FIG. 9D.

Each of the examples shown in FIGS. 9B-9D may enable additional flexibility with regard to routing lateral escape wiring lines 104 in the Y direction (i.e., the direction parallel to the edge of the processor die 102), and may also enable additional flexibility with regard to routing wiring escapes in the X direction. The example shown in FIG. 9B may also have the effect of requiring fewer mechanical connections, and this may also allow for a higher inductive path. The example shown in FIG. 9D may allow for increased flexibility with regard to routing lateral escape wiring lines 104, but it may have drawbacks with regard to reliability depending on the dimension of the capacitor (or chip 110) and the space taken up with C4 electrical interconnections. Also, with regard to FIG. 9D, this example may have less of the inductance benefit associated with FIG. 9B. In the example of FIG. 9C, where there are four groups of four interconnects (i.e., each group of four having an alternating pattern of ground interconnects 112A and voltage interconnects 112B), each grouping of interconnects may block the ability to route the lateral escape wiring lines 104 in those areas. However, with FIG. 9C there is more flexibility in the horizontal middle area 127 and the vertical middle area 129. It should be appreciated that the present embodiments are not limited to the particular interconnection patterns shown in FIGS. 9A-9D, and any other suitable interconnection pattern (e.g., of ground and voltage interconnects) may be used that allows for at least some routing of one or more escape wirings therethrough. In that regard, depending on the pattern, there may be changes in how low of an inductance path may be achieved, and also how much area of the chip 110 may be utilized for routing a lateral escape wiring line 104.

It is to be understood that the present embodiments will be described in terms of a given illustrative architecture; however, other architectures, structures, substrate materials and process steps/blocks can be varied within the scope of the present disclosure. It should be noted that certain features cannot be shown in all figures for the sake of clarity. This is not intended to be interpreted as a limitation of any particular embodiment, or illustration, or scope of the claims.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. An integrated circuit package structure comprising:
   a chip carrier substrate;
   at least one processor die provided on the chip carrier substrate;
   a plurality of lateral escape wiring lines connected to and extending away from the at least one processor die; and
   a plurality of chips at least partially surrounding the processor die, at least one of the chips overlapping with at least one of the lateral escape wiring lines in a plan view without electrically connecting to the at least one of the lateral escape wiring lines,
   wherein an interconnect structure of the at least one of the chips includes at least one vertical power feed structure that is configured and positioned not to overlap with the at least one of the lateral escape wiring lines in the plan view.

2. The integrated circuit package structure of claim 1, wherein the chips completely surround the processor die.

3. The integrated circuit package structure of claim 1, wherein multiple rows of the chips at least partially surround the processor die.

4. The integrated circuit package structure of claim 3, wherein the chips in a first row of the chips have widths and thicknesses that are different than widths and thicknesses of the chips in a second row of the chips.

5. The integrated circuit package structure of claim 3, wherein the multiple rows of the chips have a step-down configuration in a direction away from an edge of the processor die such that heights of the chips in each row are successively reduced.

6. The integrated circuit package structure of claim 1, wherein the chips are interdigitated area array interconnected decoupling capacitors built on a silicon substrate.

7. The integrated circuit package structure of claim 1, wherein the chips are devices selected from the group consisting of inductors and resistors.

8. The integrated circuit package structure of claim 1,
   wherein the lateral escape wiring lines are arranged in a fan-out configuration from the processor die, transitioning from a fine pitch spacing of the lateral escape wiring lines in a first area near edges of the processor die to a coarser pitch spacing of the lateral escape wiring lines in a second area corresponding to an off-module interconnect structure, and
   wherein the chips are located in the first area.

9. The integrated circuit package structure of claim 8, further comprising a plurality of secondary chips located in the second area and at least partially surrounding the chips.

10. The integrated circuit package structure of claim 9, wherein the secondary chips are low inductance interdigitated area array interconnected capacitors.

11. The integrated circuit package structure of claim 1, further comprising a plurality of remote interdigitated area array interconnected decoupling capacitors positioned further away from an edge of the processor die than the chips and at least partially surrounding the chips.

12. The integrated circuit package structure of claim 1, wherein the interconnect structure of the chips includes at least one pair of the vertical power feed structure and a ground structure.

13. The integrated circuit package structure of claim 12, further comprising a plurality of pairs of the vertical power feed structures and the ground structures.

14. The integrated circuit package structure of claim 13, wherein the pairs are located in each corner of the chip.

* * * * *